United States Patent [19]

Hongo et al.

[11] Patent Number: 4,609,566
[45] Date of Patent: Sep. 2, 1986

[54] METHOD AND APPARATUS FOR REPAIRING DEFECTS ON A PHOTO-MASK PATTERN

[75] Inventors: Mikio Hongo; Katsurou Mizukoshi; Tateoki Miyauchi, all of Yokohama; Takao Kawanabe, Tokorozawa; Yasuhiro Koizumi, Sayama, all of Japan

[73] Assignee: Hitachi, Ltd., Tokyo, Japan

[21] Appl. No.: 713,860

[22] Filed: Mar. 20, 1985

[30] Foreign Application Priority Data

Mar. 21, 1984 [JP] Japan ................ 59-52128

[51] Int. Cl.⁴ .............. B05D 3/06; C23C 14/00; C23C 16/00
[52] U.S. Cl. ................ 427/53.1; 118/50.1; 118/720; 118/725; 219/121 LM; 346/76 L; 346/108; 427/142; 430/5; 430/945
[58] Field of Search ........... 219/121 LM; 346/76 L, 346/108; 427/10, 53.1, 54.1, 142; 430/5, 330, 331, 938, 945; 118/50.1, 720, 725

[56] References Cited

U.S. PATENT DOCUMENTS

| | | | |
|---|---|---|---|
| 4,304,805 | 12/1981 | Packo et al. | 427/142 X |
| 4,444,801 | 4/1984 | Hongo et al. | 427/10 |
| 4,463,073 | 7/1984 | Miyauchi et al. | 427/53.1 X |
| 4,510,222 | 4/1985 | Okunaka et al. | 427/53.1 X |

OTHER PUBLICATIONS

Ehrlich, Daniel J. et al, *Laser Microphotochemistry for Use in Solid-State Electronics,* Journal of Quantum Electronics, vol. QE-16, No. 11, Nov. 1980.

Singer, Peter H., *Photomask and Reticle Repair: Equipment and Techniques,* Semiconductor International, pp. 79-86, 88, 90, Sep. 1982.

*Primary Examiner*—Michael R. Lusignan
*Attorney, Agent, or Firm*—Antonelli, Terry & Wands

[57] ABSTRACT

A photo-mask is mounted on a repairing chamber, with its mask pattern forming surface being exposed to the interior of the chamber. Vaporized repairing material which includes a metallic element is introduced into the chamber, and a laser beam is projected from the exterior of the chamber onto a transparent defect of the mask pattern. The irradiated portion is heated and the vaporized repairing material at the heated portion is resolved, resulting in the metal resolved from the repairing material deposits and fills the transparent defect. Thus, transparent defects of a mask pattern can be repaired in a simplified process.

25 Claims, 7 Drawing Figures

METHOD AND APPARATUS FOR REPAIRING DEFECTS ON A PHOTO-MASK PATTERN

BACKGROUND OF THE INVENTION

The present invention relates to a method and apparatus for repairing efficiently white-spot defects on a photo-mask pattern.

Defects created on a photo-mask fall into two categories, a residual defect (opaque-spot defect) which is an opaque material left at a portion of the mask that must be transparent, and a transparent defect (white-spot defect) which is the absence of an opaque material at a portion of the mask that must be black. These defects impair the yield of product of semiconductor devices such as LSIs, and their repairing process greatly affects the productivity of the devices. Therefore, the repairing process must be as simple as possible, and must be done in a minimal time. Among defects created on a photo-mask, the repairing process for residual defects has been simplified considerably through the introduction of laser technology as disclosed in, for example, Japanese Patent Publication No. 52-9508. Whereas, transparent defects are generally repaired by the "lift-off" method as disclosed in, for example, P.H. Singer: Photomask and Reticle Repair; Equipment and Techniques: Semiconductor International 1982/8 pp. 79–90, pp. 86–88 or U.S. Pat. No. 4,444,801.

The lift-off method includes the following process steps.

(1) Application of positive-type photoresist on a pattern of photomask which includes transparent defect(s).

(2) Exposure of only the defective portion to the light by the partial exposing method.

(3) Opening of a window at the defective portion of the photoresist film by the developing process.

(4) Formation of a metallic film by sputtering over the photoresist film at the defective portion and its periphery, or on the entire surface of the photo-mask.

(5) Removal of the photoresist and unnecessary metallic film on the photoresist film, so that only the transparent defect(s) are covered by the metallic film.

The lift-off method includes numerous steps of process as described above, leaving a technological problem from the viewpoint of productivity.

Recently, there has been reported a method of metal deposition from the organic metal solution through the irradiation of laser, offered in the field other than photo-mask technology. (Refer to an article entitled, "Metal Deposition from Organic Metal Solution by Irradiation of Laser", p. 202, in the proceedings of the 30th Annual Conventional Record of Joint Applied Physics Societies, Spring 1983.)

In this method, as shown in FIG. 1, benzene solution 1 including Cr-complex or Mo-complex is filled in a cell 3 having two glass windows 2a and 2b, and a laser beam 4 is focused by an objective lens 5 onto the interior surface of the glass window 2a, and then metal 6 is deposited.

The inventors of the present invention have attempted to apply this technique to the repairing of defects on the photo-mask pattern. However, Cr-complex or Mo-complex used in this process is very unstable, and apt to create oxide when exposed to oxygen in the atmosphere, posing a handling problem. Moreover, deposited metal is apt to form a gathering of particles. Therefore, there are still technical problems to be solved before applying this method to the repairing of defects on the photo-mask pattern.

In addition to the above methods, there has been reported a technique of repairing the transparent defects by resolving and depositing a metal from organic metallic gases by means of laser beam projection. Such a technique has been disclosed for example in D. J. Ehrlich et al's article: Laser Microphotochemistry for use in Solid State Electronics; IEEE Vol. QE-16 No. 11, pp. 1233–1243 (1980, 11). However, dimethyl cadmium referred to in the article is also apt to create oxide when exposed to oxygen in the atmosphere. Since dimethyl cadmium is difficult to be treated, there are technical problems to be solved before this method can become practical. Further, there is no disclosure about a repairing apparatus in the article.

SUMMARY OF THE INVENTION

The present invention contemplates to solve the foregoing technical problems, and its prime object is to provide a method of repairing defects on a photomask pattern capable of repairing defects in a reduced number of steps of process and in a shorter time.

Another object of the invention is to provide an apparatus of repairing defects on a photo-mask pattern capable of repairing defects easily in a short time.

The present invention overcomes the foregoing problems by implementing the defect repairing process in the vacuum. Namely, the invention features that a photo-mask to be repaired is placed in a vacuum chamber where repairing material is sublimated by heating, preferably by projecting a laser beam, only a defective portion of the photo-mask is heated preferably by the laser beam, and the sublimated repairing material is resolved so that the resolvent metal in the repairing material deposits at the defective portion of the photo-mask, thereby repairing the defect.

BRIEF DESCRIPTION OF THE DRAWINGS

FIG. 5 is a longitudinal cross-sectional view of the repairing chamber in which a photo-mask is fixed on the bottom; and.

DESCRIPTION OF THE PREFERRED EMBODIMENTS

Figure 2:
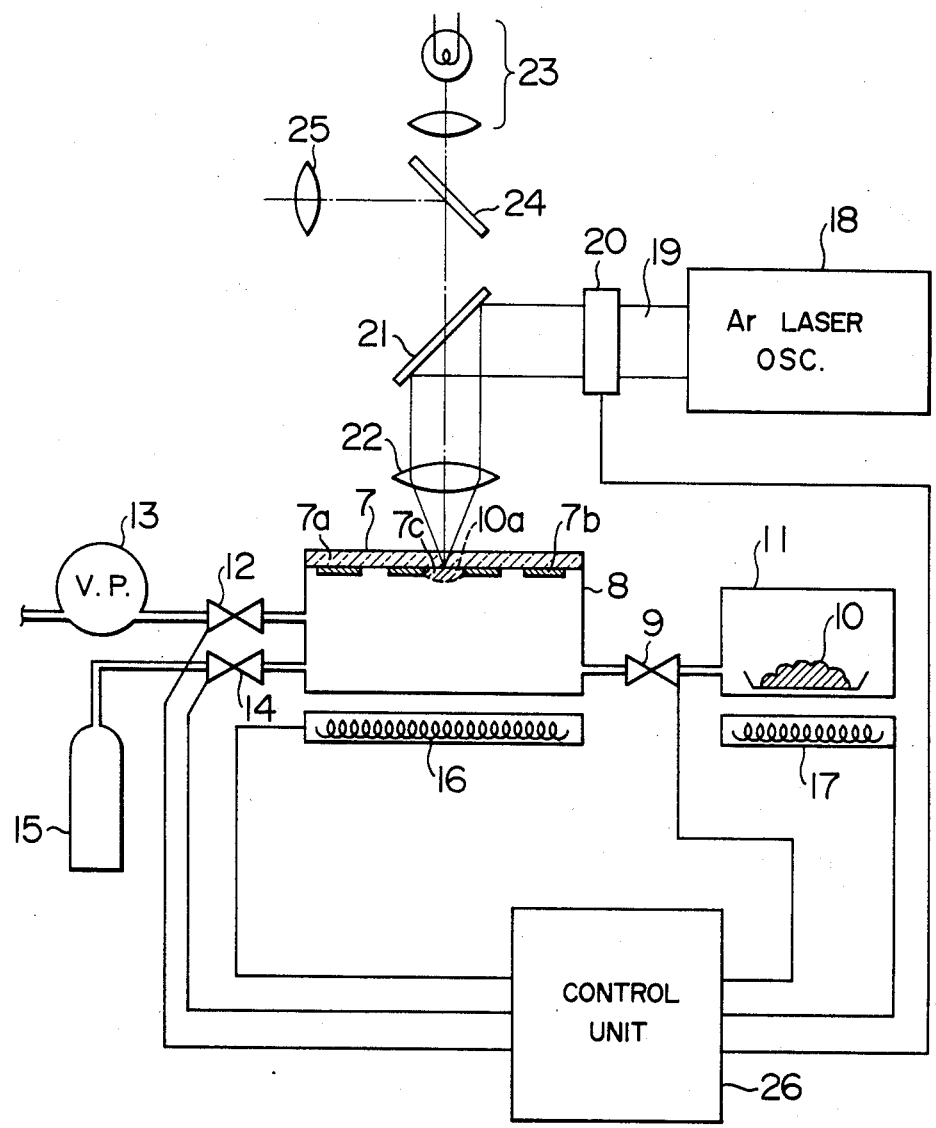
FIG. 2 is a schematic diagram showing the general arrangement of the apparatus embodying the present invention.

An embodiment of this invention will now be described in detail with reference to the drawings. In FIG. 2, a repairing chamber 8 with a defective photo-mask mounted thereto is arranged to communicate through pipes with a container 11 in which a repairing material (e.g., bisbenzene chromium or bisbenzene molybdenum) 10 is accommodated via a valve 9, with a vacuum pump 13 via a valve 12, and with an inert gas cylinder 15 via a valve 14. The photo-mask 7 is made of a transparent substrate 7a with mask patterns 7b being formed on one surface of the substrate. The repairing chamber 8 and repairing material container 11 have associated heaters 16 and 17 so that they are heated separately. An Ar-laser source 18 provides a laser beam 19, which is led through a shutter 20, reflected by a dichroic mirror 21, and focused by an objective lens 22 onto a transparent defect 7c of the pattern 7b on the photo-mask 7. An illumination system 23, half mirror 24 and eyepiece 25 in combination constitute an observation optical system. The operation of the valves 9, 12 and 14, vacuum pump 13, heaters 16 and 17, and shutter 20 are all controlled by a control unit 26.

By closing the valve 9, the repairing material container 11 is maintained in a vacuum state or filled with inert gas so that the repairing material stored in it is prevented from oxidizing.

Figure 1:
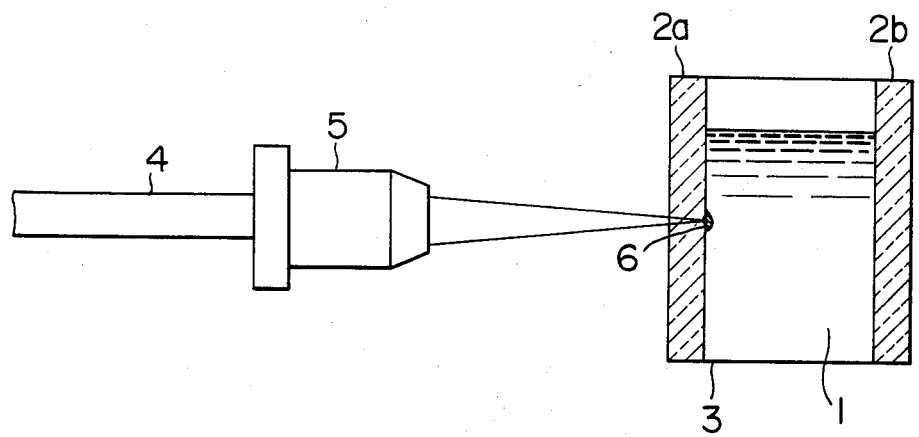
FIG. 1 is an illustration showing the principle of metal deposition by the irradiation of laser.
Figure 3:
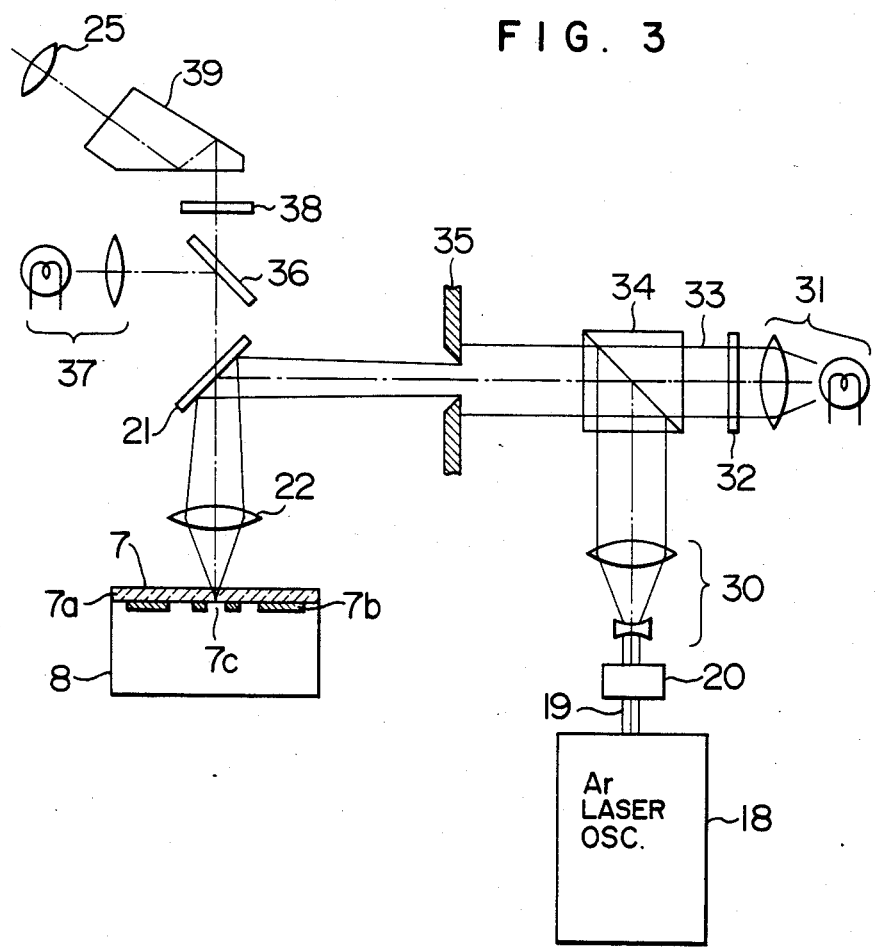
FIG. 3 is a schematic diagram showing the optical system of the apparatus shown in FIG. 2.

FIG. 3 shows the details of the laser optical system employed in the pattern repairing apparatus shown in FIG. 2. In the figure, the laser beam 19 provided by the laser source 18 is made to have an increasing beam diameter by a beam expander 30, conditioned by a coupling optical system 34 to have a common optical axis with a reference light beam 33 provided by the combination of a reference light source 31 and an interference filter 32, and projected to a rectangular slit 35. With the shutter 20 kept closed, the operator adjusts the image of the rectangular slit 35 produced by the reference light beam 33 to the position and size of a transparent defect on the photo-mask 7 mounted on the repairing chamber 8, while observing the defective portion through the objective lens 22, dichroic mirror 21, half mirror 36, illuminating optical system 37, laser cut filter 38, prism 39, and eyepiece 25. At this time, the rectangular slit 35, objective lens 22 and photo-mask 7 are in a positional relationship so that an image of the slit 35 is focused on the photo-mask 7 in a reduced scale of 1/M, where M is the magnification of the objective lens 22. In this state, the operator opens the shutter 20 for a certain time length, and the laser beam 19 of exactly the same size and position as those of the image of the slit 35 is projected onto the defect. The reference light beam 33 is conditioned by the interference filter 32 so that chromatic aberration is not created due to the wavelength of the laser beam 19 and the objective lens 22 and both beams are coupled with the coupling optical system 34. The dichroic mirror 21 preferably has a sufficiently high reflectivity for the wavelength of the laser beam 19, a reflectivity of around 50% for the reference light beam 33, and a sufficiently high transmittance for other wavelengths.

In case the laser beam 19 is a linearly polarized light, a polarizing beam splitter may be used for the coupling optical system 34, so that after being coupled the laser beam 19 and the reference light beam 33 have exactly the same wavelength and polarizing directions intersecting each other at right angles. In this case, by using a dichroic mirror 21 having a sufficiently high reflectivity in the polarizing direction of the laser beam and a reflectivity of around 50% for the intersecting polarized component, and a laser beam cutoff filter 38 with characteristics of reflecting or absorbing the polarized component of the laser beam 19, the chromical aberration of the laser beam 19 and reference light beam 33 can completely be ignored in the repairing process.

Figure 4:
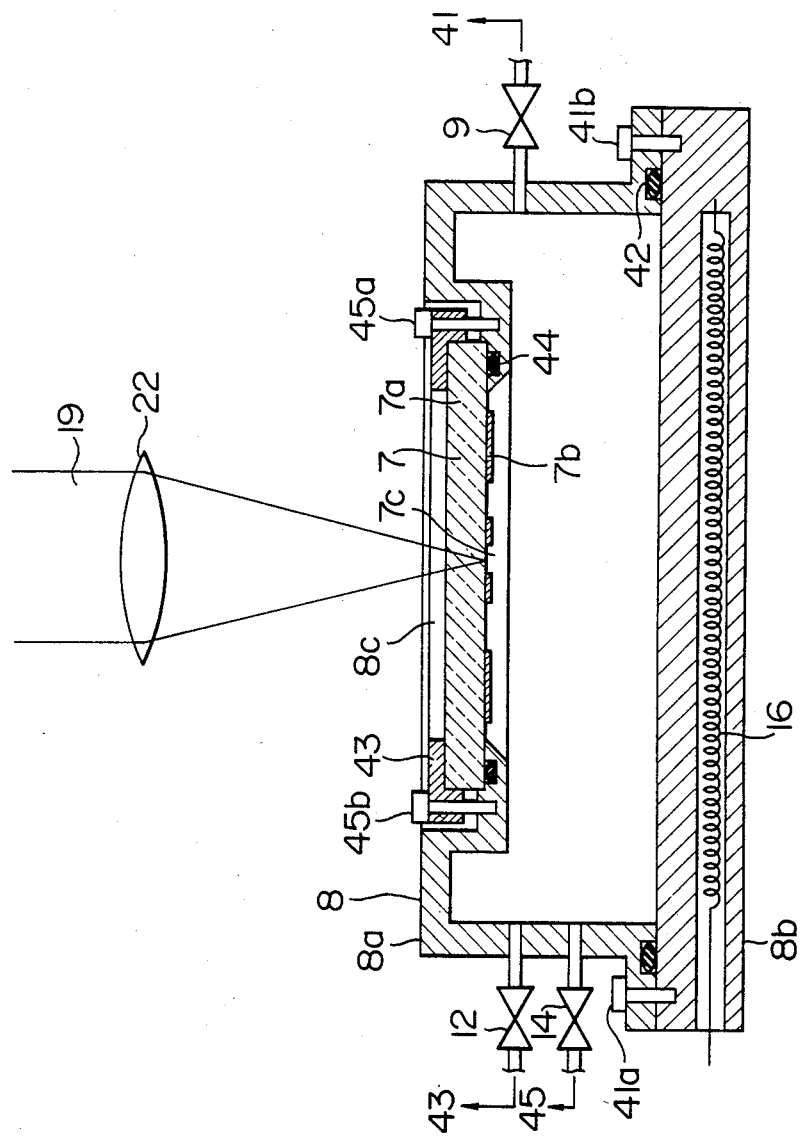
FIG. 4 is a longitudinal cross-sectional view of the repairing chamber in which a photo-mask itself serves for providing hermetic sealing.

FIG. 4 shows the details of the repairing chamber 8 used in the apparatus shown in FIG. 2. The repairing chamber 8 is made up of members 8a and 8b that are press-fitted by screws 41a and 41b through an O-ring 42 to form a hermetic sealed room. The upper member 8a has an opening 8c, and it is closed by the photo-mask 7 which is fixed to the member 8a using a mask clamp 43, O-ring 44 and screws 45a and 45b. The photo-mask 7 is fixed with its pattern forming surface facing the interior of the chamber, and the laser beam 19 is focused by the objective lens 22 and projected through the mask substrate 7a onto the defective portion 7c. The repairing chamber 8 has the pipes to the repairing material container 11 via the valve 9, to the vacuum pump 13 via the valve 12 and to the inert gas cylinder 15 via the valve 14. The repairing chamber 8 is provided therein with a heater 16, so that the internal temperature is monitored using a thermocouple or the like (not shown) and maintained at a specified temperature.

The repairing process for a transparent defect on the photo-mask using the foregoing apparatus is carried out as follows. In FIG. 2, a photo-mask 7 including a transparent defect is mounted on the repairing chamber 8 shown in FIG. 4. All valves 9, 12 and 14 are closed, so that the repairing chamber 8 is hermetically sealed. Next, the valve 12 is opened so as to evacuate the repairing chamber 8 with the vacuum pump 13, and the heaters 16 and 17 are turned on so as to heat the repairing chamber 8 and repairing material container 11. This heating operation may take place continuously throughout the process. Sublimation occurs at 100°-290° C. when the repairing material 10 is bisbenzene chromium, or at 50°-100° C. when the material is bisbenzene molybdenum. After the occurrence of sublimation of the repairing material, the valve 9 is opened so that the repairing material gas is introduced into the repairing chamber 8. In this state, the operator positions the spot of the laser beam 19 to the transparent defect, while observing the mask through the illuminating optical system 23, half mirror 24, eyepiece 25 and objective lens 22. This positioning operation is carried out by a known method such as the use of an X-Y positioning table on which the repairing chamber 8 or the optical system is placed. Next, the shutter 20 is opened for a certain time length so that the laser beam 19 is projected onto the defective portion 7c. The defective portion 7c is heated by the laser beam, and the repairing material 10 is resolved at a temperature above 300° C. in the case of bisbenzene chromium or above 110° C. in the case of bisbenzene molybdenum, resulting in a deposition of metal 10a on the photo-mask. That is, by the irradiation of laser to the transparent defect 7c, chromium or molybdenum 10a deposits only at the defective portion in the form of chromium carbide or molybdenum carbide, respectively, and it is repaired. If the photo-mask 7 includes more than one transparent defect, the above operation is repeated until all defects are repaired. Next, the valve 9 is closed and, after the repairing chamber 8 has been evacuated completely, the valve 12 is closed and the valve 14 is opened so that the inert gas in the cylinder 15 is introduced into the repairing chamber 8 substantially to the atmospheric pressure. Alternatively, evacuation may be carried out while introducing the inert gas. After all valves have been closed to hermetically seal the repairing chamber 8, the photo-mask 7 is removed from the repairing chamber 8, and the repairing process completes.

When the optical system shown in FIG. 3 is used, metal 10a can be deposited in a rectangular area of an arbitrary size on the mask pattern surface, as against the case of the optical system shown in FIG. 2 in which metal is deposited in a circular area on the mask pattern surface, whereby high accuracy repairing is made possible.

The pattern repairing process needs only the step of focusing the laser beam and the step of positioning the laser beam to a defect, and the valves and heaters are operated automatically by the control unit 26.

Heating and sublimation of the repairing material and resolution of the repairing material in the repairing chamber 8 are all implemented in the vacuum, and evacuation is carried out using inert gas (any gas which does not react to the repairing material). This prevents the repairing material from oxidation and ensures the deposition of metal at the transparent defect so that it is repaired.

The foregoing description is made about the example wherein Ar laser is used as the laser beam source. However, it is possible to use, as the laser beam source, the second harmonics (ultra-violet wavelength) of Ar laser. In this case, it is necessary to use, as the substrate of the photomask 7, a material having the transparency of ultra-violet light, such as quartz glass. Further, in this case, as a reference light beam 33 in FIG. 3, it is desirable to use a visible light beam of particular wavelength selected by the interference filter 32, and to use a dichroic mirror 21 having a sufficiently high reflectivity for the laser beam (of ultra-violet wavelength), a reflectivity of around 50% for the reference light beam and a sufficiently high transparency for the other wavelengths.

When the laser beam of ultra-violet wavelength is employed, a repairing material is resolved by the light energy of the ultra-violet laser beam so as to deposit chromium (when using bisbenzene chromium as the repairing material) or molybdenum (when using bisbenzene molybdenum) only at the portion at which the laser is projected, whereby the repair of a defective portion can be carried out.

Figure 5:
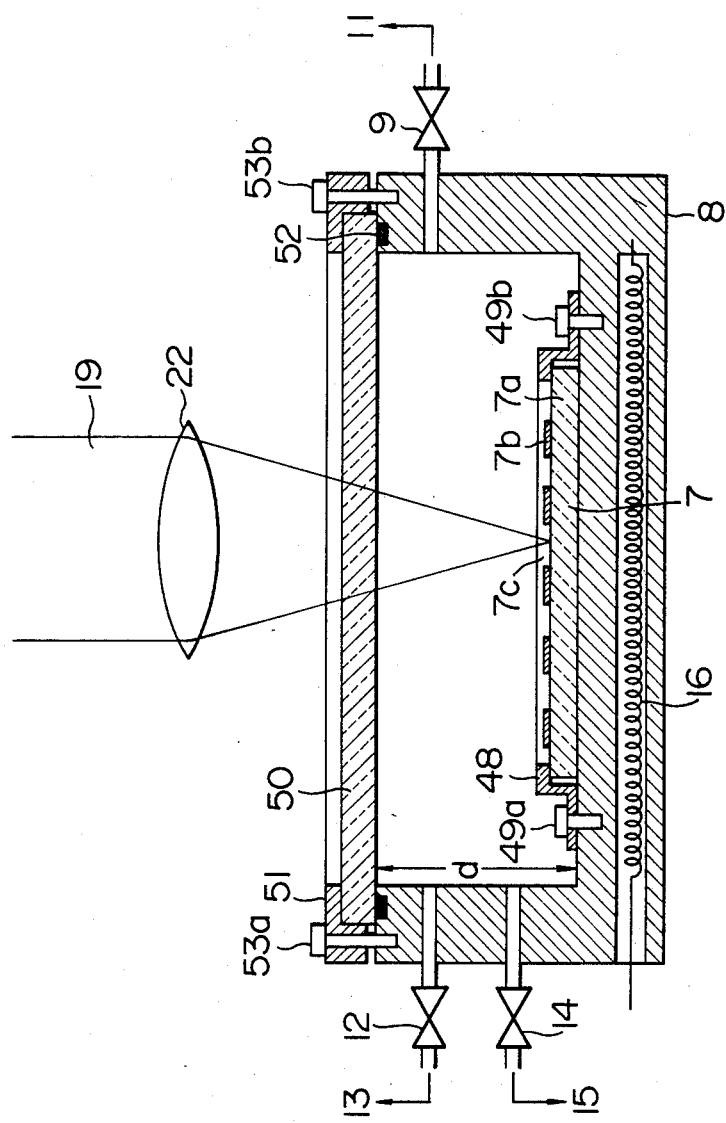

FIG. 5 shows a modified arrangement of the repairing chamber 8. The repairing chamber 8 has the pipe to the repairing material container 11, vacuum pump 13 and inert gas cylinder 15 via the valves 9, 12 and 14, respectively, as in the arrangement of FIG. 4. A photomask 7 is fixed using a mask clamp 48 and screws 49a and 49b inside the repairing chamber 8 with its pattern forming surface facing upward. A window member 50 which transmits the laser beam 19 is fixed to the top of the repairing chamber 8 using an O-ring 51, clamp 52 and screws 53a and 53b, and it is removed when the photo-mask 7 is mounted or dismounted. The repairing chamber 8 is provided therein with a heater 16, so that the internal temperature is monitored using a thermocouple or the like (not shown) and maintained at a specified temperature. The depth d of the repairing chamber 8 is made as large as possible within the range of the working distance of the objective lens 22 so as to prevent the deposition of metal on the window member 50.

In this embodiment, it is also possible to use the second harmonics of Ar laser as the laser beam source. In this case, an ordinary glass other than the quartz glass may be used as the substrate of the photo-mask 7.

Figure 6:
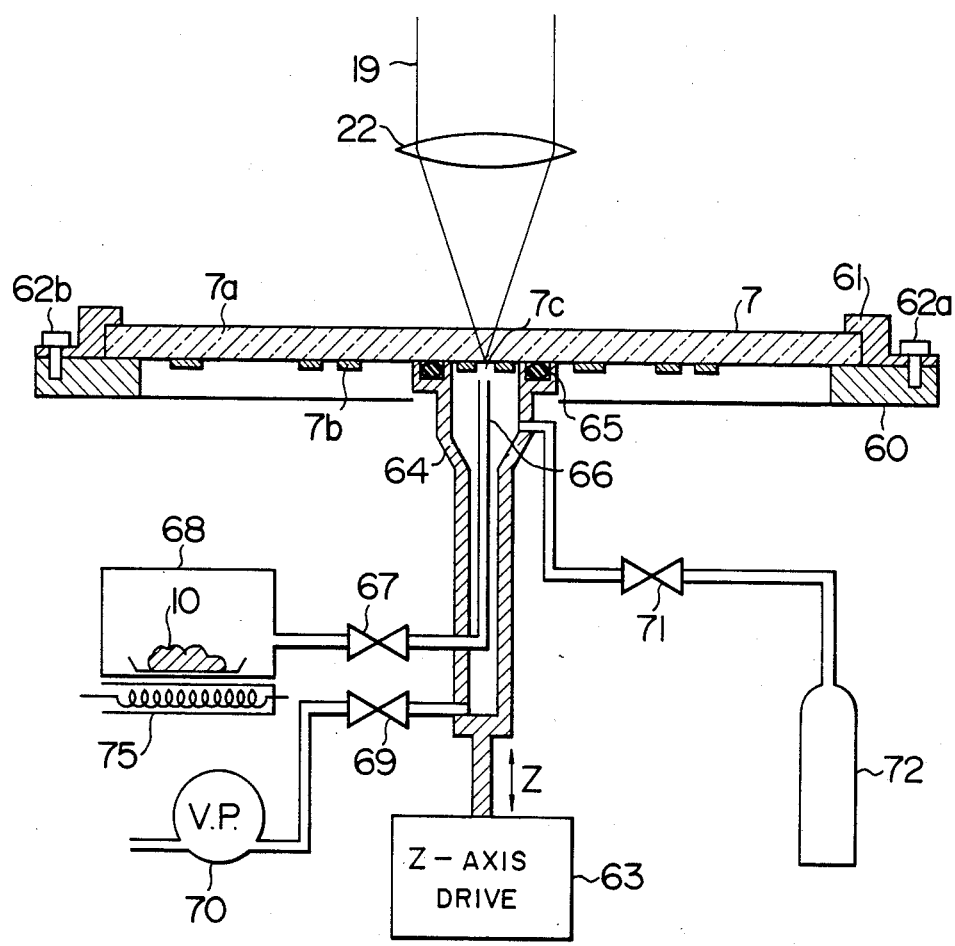
FIGS. 6 and 7 are schematic diagrams showing the principal portion of other embodiments of the invention, in which the repairing chamber is located below (FIG. 6) or above (FIG. 7) a photo-mask to be repaired, with the repairing chamber or photo-mask being moved horizontally so that the laser beam is positioned to a defect on the photo-mask.
Figure 7:
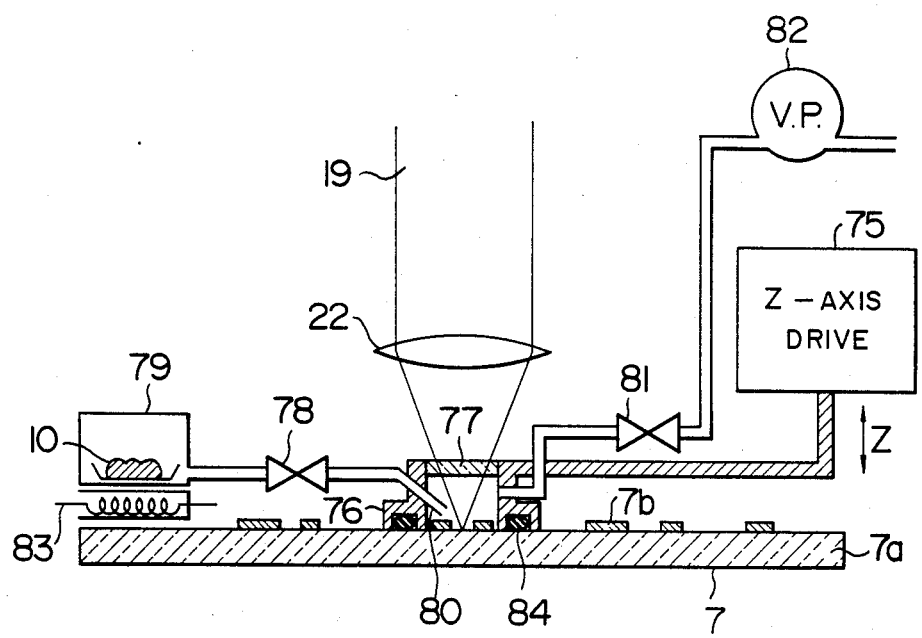

FIGS. 6 and 7 show other embodiments of the invention, in which the repairing chamber or the photo-mask 7 is moved to achieve the positioning of the laser beam 19 to the transparent defect 7c on the photo-mask pattern 7b. The arrangement of FIG. 6 includes a stage 60 which is movable in the x-y directions and has its lower portion left open (the x-y movement mechanism is a known device and is not shown in the figure), and on the stage 60 there is fixed a photo-mask 7 with its pattern surface facing downward using a mask clamp 61 and screws 62a and 62b. The x-y stage 60 is provided on its bottom side with a repairing chamber 64 which is movable in the vertical (z) direction by a drive mechanism 63 so that the repairing chamber 64 is moved upward and pressed to the photo-mask 7 through an O-ring 65 thereby to achieve hermetic sealing between the photo-mask and chamber. The repairing chamber 64 is provided therein with a nozzle 66, and has the pipe to a repairing material container 68 via a valve 67, to a vacuum pump 70 via a valve 69, and to an inert gas cylinder 72 via a valve 71. The container 68 stores the repairing material 10, which can be heated with a heater 75.

The pattern repairing process is as follows. After the x-y stage 60 has been operated so that the laser beam is positioned to a transparent defect using the optical system shown in FIG. 2 or FIG. 3, the repairing chamber 64 is pressed to the photo-mask 7, and then the valve 69 is opened so as to evacuate the repairing chamber 64 using the vacuum pump 70. The heater 75 is activated to heat the repairing material 10 in the container 68. Sublimation occurs at 100°–290° C. when the repairing material is bisbenzene chromium, or at 50°–100° C. when it is bisbenzene molybdenum. The valve 67 is opened, and the sublimating material gas is introduced through the nozzle 66 into the repairing chamber 64.

In this state, the laser beam 19 is focused with the objective lens 22 onto the transparent defect 7c through the glass substrate 7a. When the laser spotting portion of the mask exposed to the vapor of the repairing material has exceeded 300° C. in the case of bisbenzene chromium, or 110° C. in the case of bisbenzene molybdenum, the repairing material resolves to deposit chromium or molybdenum in the form of chromium carbide or molybdenum carbide to cover the transparent defect. For example, when the vapor of repairing material $Cr(C_6H_6)_2$ at the defective portion is heated to a temperature above the resolving temperature, it resolves into $Cr + 2C_6H_6$, causing the deposition of metallic chromium. Upon completion of laser irradiation, the valve 67 is closed and the valve 71 is opened so that the vapor of repairing material is removed from the repairing chamber 64 while introducing the inert gas into it. Thereafter, the valves 67 and 71 are closed, and the drive mechanism 63 is activated to separate the repairing chamber 64 downward. The repairing process is thus completed.

In the arrangement of FIG. 7, a photo-mask 7 is placed with its pattern surface facing upward on a usual x-y stage (not shown). Provided over the photo-mask 7 is a repairing chamber 76 which can be moved vertically (in Z direction) by means of a drive mechanism 75. The repairing chamber 76 has a window 77 which transmits a laser beam 19, and it is further provided therein with a nozzle 80 which communicates with a repairing material container 79 via a valve 78. The chamber 76 has another piping to a vacuum pump 82 via a valve 81 (and to an inert gas cylinder via a valve when necessary). The container 79 stores the repairing material 10 such as bisbenzene chromium or bisbenzene molybdenum, which can be heated with a heater 83. After the laser beam has been positioned to a defect on the photomask 7 using the optical system shown in FIG. 2 or FIG. 3 with the repairing chamber 76 being lifted above the photo-mask by the drive mechanism 75, the chamber 76 is pressed to the photo-mask 7 through the operation of the drive mechanism 75 so that the chamber 76 is hermetically sealed through an O-ring 84. The valve 81 is opened to evacuate the repairing chamber 76 with the vacuum pump 82, the valve 78 is opened to introduce the vapor of repairing material 10 through the nozzle 80, and the laser beam 19 is projected through the window 77 onto the defective portion. Thereafter, the valve 78 is closed and the vapor of repairing material is completely removed from the chamber 76, while introducing the inert gas into the chamber 76. Finally, the repairing chamber 76 is lifted upward using the drive mechanism 75, and the repairing process is completed.

In the embodiment shown in FIG. 6, the ultraviolet laser beam such as the second harmonics of Ar laser can be used only where the photo-mask substrate 7a is made of a material having the transparency of ultra-violet wavelength such as, for example, the quartz glass. In FIG. 7, the ultra-violet laser beam can be used irrespective of the material of the photo-mask substrate 7a. In both the cases, the vapor of a repairing material is resolved by the light energy of the ultra-violet laser beam so as to deposite chromium or molybdenum only at the portion at which the laser beam is projected, whereby a defective portion can be repaired.

Also in these embodiments of FIGS. 6 and 7, the repairing process needs only the steps of focusing the laser beam and positioning the beam to a transparent defect, and the process is carried out in the vacuum.

Although in the foregoing embodiments bisbenzene chromium or bisbenzene molybdenum is used as a repairing material, this invention is not limited to this, but other material such as, for example, bisbenzene tungsten or bisbenzene iron may also be used. The above-mentioned inert gas may be any gas including He, Ne, Ar, Kr and Xe, or nitrogen as well providing it does not react to the repairing material.

Although the Ar laser source and the second harmonics of Ar laser are used in the foregoing embodiments, the same effect is achieved through the use of the fundamental wave or higher harmonics of the YAG laser, or the Kr laser, or the Dye laser by various excitation methods, or the use of the $N_2$ laser.

If metal is deposited excessively outside the transparent defect area in the process of the inventive method, it can be corrected by the conventional repairing method for residual defects using the laser.

According to the inventive method for repairing transparent defects on the photo-mask, in which the repairing material is heated and sublimated in the vacuum and a transparent defect is heated in the vacuum so that a metal resolved from the repairing material is deposited at the transparent defect as described above in detail, all necessary steps of process are focusing of the laser beam and positioning of the laser beam to the defective portion on the mask, whereby time needed to repair defects can be reduced significantly owing to a reduced number of steps of process and thus the productivity of photo-masks can be improved significantly.

The arrangement for sublimating and resolving of the repairing material and depositing of metal on the transparent defect portion all in the vacuum effectively prevents the oxidation of metal even if it is chemically unstable. This allows a satisfactory deposition of metal instead of particle deposition, whereby transparent defects on the photo-mask can be transparent surely and accurately and thus the yield of products can be improved significantly.

We claim:
1. A method of repairing a defect of pattern on a photo-mask comprising the steps of:
 (a) mounting said photo-mask on a repairing chamber with a pattern forming surface of said mask facing inwardly, said chamber being hermetically sealed including said photo-mask plate;
 (b) introducing vapor of repairing material which includes a metallic element into said repairing chamber; and
 (c) locally heating only a defective portion of said mask to be repaired to a temperature higher than a predetermined temperature, so that the vapor of the repairing material in said repairing chamber resolves and the metal included in the material deposits at the defective portion thereby to fill the transparent defect, whereby the metal of the rapairing material deposits at the defective portion from the vapor of the repairing material due to the local heating of the defective portion.

2. A pattern repairing method according to claim 1, wherein said heating step (c) includes a step of projecting a laser beam from the exterior of said repairing chamber onto the defective portion of said mask so that only said defective portion is heated.

3. A pattern repairing method according to claim 2, wherein in said mask mounting step (a) said photo-mask constitutes part of a wall of said repairing chamber, and wherein in said heating step (c) said laser beam is projected from the exterior of said repairing chamber onto the defective portion of said mask through a transparent mask substrate of said photo-mask.

4. A pattern repairing method according to claim 1, wherein said repairing material is accommodated in a separate sealed container, and wherein said vapor introduction step (b) includes a sub-step of heating said repairing material inside said container so that said material is sublimated, and another sub-step of introducing the vaporized repairing material in said container into said repairing chamber.

5. A pattern repairing method according to claim 1, wherein said vapor introduction step (b) includes a sub-step of evacuating said repairing chamber prior to the introduction of the vaporized repairing material into said repairing chamber.

6. A pattern repairing method according to claim 2, wherein said heating step (c) includes a sub-step of positioning the laser beam to the defective portion prior to the heating of the defective portion by the laser beam.

7. A pattern repairing method according to claim 2, wherein said repairing chamber has a transparent window as at least part of a wall of said chamber, and wherein in said mask mounting step (a) said photo-mask is mounted with a pattern forming surface thereof facing said window within said repairing chamber, and wherein in said heating step (c) the laser beam is projected from the exterior of said repairing chamber onto the defective portion through said window.

8. A pattern repairing method according to claim 1, wherein said heating step (c) includes at the end thereof a sub-step of removing the vaporized repairing material from said repairing chamber and another sub-step of introducing inert gas into said repairing chamber.

9. A pattern repairing method according to claim 1, wherein said repairing material includes a material selected from the group consisting of bisbenzene chromium, bisbenzene molybdenum, bisbenzene tungsten and bisbenzene iron.

10. A pattern repairing method according to claim 2, wherein said heating step (c) includes a sub-step of implementing a relative movement between said repairing chamber and said laser beam so as to position said laser beam to the defective portion prior to the projection of said laser beam.

11. An apparatus for repairing a defect of pattern on a photo-mask comprising:
 a repairing chamber mounting said photo-mask plate with a pattern forming surface thereof facing the interior of said chamber, so that said chamber is hermetically sealed including said photo-mask;
 means for evacuating said repairing chamber;
 means for introducing vaporized repairing material which includes a metallic element into said repairing chamber;
 means for locally heating only a defective portion of said mask to be repaired to a temperature higher than a predetermined temperature, said temperature being a temperature at which the vapor of the repairing material in the repairing chamber resolves and the metal included in the repairing material deposits at the defective portion thereby to fill the defective portion, whereby the metal of the repairing material can be deposited at the defective portion from the vapor of the repairing material due to the local heating of the defective portion; and
 control means connected to said evacuation means and said vapor introduction means, and adapted to control the passage of gas to and from said repairing chamber.

12. A pattern repairing apparatus according to claim 11, wherein said repairing chamber includes a transparent member as at least part of a wall of said chamber, and wherein said heating means comprises a laser optical system including a laser source and an objective lens so that a laser beam is focused and projected from the exterior of said repairing chamber onto the defective portion on said mask through said transparent member.

13. A pattern repairing apparatus according to claim 12, wherein said repairing chamber is movable relative to said laser optical system so that the laser beam is positioned to the defective portion, said apparatus further including an optical system for the observation of the state of positioning.

14. A pattern repairing apparatus according to claim 12, wherein said laser optical system includes an open slit for defining a laser irradiation area on the defective portion on said mask.

15. A pattern repairing apparatus according to claim 12, wherein said photo-mask constitutes part of a wall of said repairing chamber, said laser beam being projected from the exterior of said repairing chamber onto the defective portion of said mask through a transparent mask substrate of said mask.

16. A pattern repairing apparatus according to claim 12, wherein said photo-mask is mounted on a wall inside said repairing chamber confronting said transparent member so that a pattern forming surface of said photo-mask faces said transparent member.

17. A pattern repairing apparatus according to claim 11, wherein said repairing material includes a material selected from the group consisting of bisbenzene chromium, bisbenzene molybdenum, bisbenzene tungsten and bisbenzene iron.

18. A pattern repairing apparatus according to claim 11 further comprising:
 a container for accommodating said repairing material connected through a first pipe to said repairing chamber, said container being provided with heating means for sublimating said repairing material;
 first valve means provided on said first pipe and operated to open or close under control of said control means; and
 second valve means provided on a second pipe for connecting said repairing chamber with said evacuation means and operated to open or close under control of said control means.

19. A pattern repairing apparatus according to claim 17 further comprising:
 means for supplying inert gas into said repairing chamber through a third pipe; and
 third valve means provided on said third pipe and operated to open or close under control of said control means.

20. A pattern repairing method according to claim 1, wherein said heating step (c) is performed by projecting a light beam so as to locally heat only a defective portion of said mask to be repaired.

21. A pattern repairing method according to claim 1, wherein said heating step (c) is performed such that the metal included in the repairing material deposits only at the defective portion.

22. A pattern repairing method according to claim 1, wherein the vapor of repairing material introduced in step (b) in introduced from a repairing material container, said repairing material container being maintained in a vacuum state or filled with an inert gas such that the repairing material is prevented from oxidizing.

23. A pattern repairing apparatus according to claim 18 further comprising a third pipe for connecting the repairing material container to evacuation means, whereby the repairing material container is maintained in a vacuum state.

24. A pattern repairing apparatus according to claim 18 further comprising a third pipe for connecting the repairing material container to a source of inert gas such that the repairing material container is maintained filled with inert gas, whereby the repairing material stored in the repairing material container is prevented from being oxidized.

25. A pattern repairing apparatus according to claim 11, wherein said means for locally heating heats only the defective portion of said mask to be repaired to a temperature at which the metal included in the vapor of the repairing material deposits, such that the metal included in the vapor of the repairing material deposits only at the defective portion.

* * * * *